United States Patent [19]

Vaisanen

[11] Patent Number: 5,101,175
[45] Date of Patent: Mar. 31, 1992

[54] POWER CONTROL METHOD FOR A VOLTAGE CONTROLLED POWER AMPLIFIER AND CIRCUITRY USED IN THE METHOD

[75] Inventor: Risto Vaisanen, Salo, Finland
[73] Assignee: Nokia Mobile Phones Ltd., Salo, Finland
[21] Appl. No.: 627,810
[22] Filed: Dec. 14, 1990

[30] Foreign Application Priority Data

Dec. 22, 1989 [FI] Finland ............... 896266

[51] Int. Cl.$^5$ ............... H03G 3/30
[52] U.S. Cl. ............... 330/279; 455/126; 330/131
[58] Field of Search ............... 307/264, 493; 330/129, 330/131, 141, 278, 279, 281; 455/126, 127

[56] References Cited

U.S. PATENT DOCUMENTS 4,563,775  1/1986  Yokosuka ............... 455/126
4,754,231  6/1988  Sawa ............... 330/279

Primary Examiner—Steven Mottola
Attorney, Agent, or Firm—Darby & Darby

[57] ABSTRACT

In a digital radio telephone transmitter an output pulse with e.g. $\cos^2$-shaped edges is produced by a voltage controlled power amplifier (4). When known control loop circuitry is used, the power (Pout) of the output pulse will rise almost step-wise at the beginning of the pulse, which leads to the spreading of the spectrum and to rise time delays of the output pulse with respect to the control pulse (TXC) at different power levels. According to the invention a good $\cos^2$-shape of the output pulse (Pout) and its tracking of the control pulse (TXC) almost without delay is achieved so that a squarewave pulse ($V_p$) is added to the control voltage (V2) of the power amplifier (4), the pulse ($V_p$) starting and ending substantially at the same time as the control pulse (TXC). In a preferred embodiment the squarewave pulse ($V_p$) is added to the control voltage (V2) only during that time when the control voltage (V2) is below that value, at which the control loop begins to operate.

17 Claims, 5 Drawing Sheets

POWER CONTROL METHOD FOR A VOLTAGE CONTROLLED POWER AMPLIFIER AND CIRCUITRY USED IN THE METHOD

The invention relates to a method and a circuitry, in which the output pulse retains the same shape as the control pulse on different power levels and particularly in the beginning of the pulse.

In digital radio telephones the transmission is provided by bursts, in which the transmitted signal is formed by successive pulses. The transmitted pulse must not have a step form, but the rising and falling must be controlled so that the transmission spectrum will not spread too wide but, however, the rising and falling times should be as short as possible. The $\cos^2$-waveform is often considered suitable. In addition the transmission pulse timing must be independent of the transmitter power level. With the aid of the power control it is tried to reduce the network interference level and to reduce the power consumption of the telephone, and in the GSM-system, for instance, the control is based on measurements made by the base stations. In said system the control range is 30 dB and comprises 16 power levels between +43 dB and +13 dB.

In this specification a telephone of the GSM-system is used as an example, but the specification is also applicable to other digital systems in which the rise and fall of the transmitted pulse has a $\cos^2$-shape or a corresponding shape. The transmitter of a known digital radio telephone comprises a voltage controlled RF power amplifier, which is controlled by a control amplifier in accordance with a control logic and the output power of the power amplifier. A typical transmitter block diagram of a GSM radio telephone of this kind is shown in FIG. 1. There the input square wave pulses Pin are amplified in a desired way and their rise and fall transformed into a $\cos^2$-shape in a multi-stage power amplifier 1. The output power is measured by a directional coupler 2 and a power sensing element 3, which produces a voltage V1 proportional to the power. This voltage is directed to a control amplifier 4, which can be an operational amplifier, and the second input of the control amplifier receives a control pulse TXC from a D/A-converter. The amplitude and the rising and falling edge waveforms of the transmit pulse Pout with the desired power are produced with the aid of the control pulse. If the voltage V1 is higher than the voltage TXC, the output voltage of the power amplifier 4 is adjusted lower, whereby the output voltage naturally decreases. Thereby the control loop tries to keep the output pulse shape equal to the control pulse shape.

However, in practice the situation is far more complicated and difficult. The control loop's cut-off frequency and open-loop gain, which mainly are determined by the components R1, R2, R3 and C1, should be relatively high so that the control loop could keep the pace also when the control pulse TXC is small. In most cases, however, it is not possible to sufficiently increase the cut-off frequency and the open-loop gain, because the control amplifier 4 and the power amplifier 1 exhibit delays which are evident e.g. in the open-loop phase response. In practice a control loop designed to be sufficiently rapid is therefore generally unstable, i.e. it oscillates either in a damped way or, in the worst case, undamped. If the loop's cut-off frequency or gain are reduced the regulation will be slower, and the power cannot rise in the required time on the lowest power levels. FIGS. 2A and 2B show the voltages Vout ($\approx$Pout), TXC and the control voltage V2 in a situation, where a pulse begins to rise towards the peak value and where the control loop is stabilized by making it slower, either by decreasing the cut-off frequency or the gain. FIG. 2A shows a situation at a high power level and FIG. 2B at a low power level. The voltage TXC is scaled to be as high as the output voltage of the power amplifier, although in reality TXC is of course very low. In the figures V3 is that value of the control voltage V2, at which the power amplifier 1 begins to produce power. Leaking power is produced also at lower voltage values than this one, and therefore the voltage V2 must start to rise from a value clearly lower than the voltage V3. The voltage V3 is also temperature and channel frequency dependent. In FIG. 2A it is shown that the power amplifier output pulse will not start to rise slowly from zero at time T=0 but power is produced only at time T3 when the power rises almost step-wise until the control loop begins to operate. The maximum power is achieved at time T1. FIG. 2B shows a situation where the control pulse TXC level is clearly lower than in FIG. 2A. On this scale the voltage V3 is situated considerably higher, even if the absolute value of V3 is the same as in FIG. 2A. The output power of the power amplifier starts to rise only at time T4 and it can be seen that the waveform of the output voltage Vout hardly follows the form of the control pulse. TXC, as it should. The maximum power is achieved at time T2, a moment $\Delta$T later than on higher power levels.

The disadvantages of this known transmitter are, as is described above, the almost step-like rising of the power amplifier's power in the beginning of the pulse, causing the spectrum to spread, and a rise-time delay ($\Delta$T) between different power levels.

The above mentioned disadvantages can be obviated in accordance with the invention so that a squarewave pulse is added to the control voltage of the power amplifier, the pulse starting and ending substantially at the same time as the control pulse directed to the control amplifier. In a most preferred embodiment the squarewave pulse is disconnected when the control loop of the power amplifier begins to operate.

The basic idea of the invention is that immediately at the beginning of the control pulse TXC the squarewave pulse rapidly increases the value of the control voltage into the proximity of the threshold level V3, at which the power amplifier begins to operate. Then the control loop can operate immediately when the power amplifier starts to produce power. No noticeable delay is thereby created, and the rise at the beginning of the output power Pout is not step-like. Due to the summing of the squarewave pulse and the control voltage a voltage division appears at the power amplifier output, affecting the power amplifier control loop and reducing the open-loop gain. In order to prevent this it is preferred to arrange it so that the squarewave pulse Vp will not be added to the control voltage when the control loop has started to operate. This is arranged with circuitry presented in a preferred embodiment of the invention.

The invention will be described in more detail referring to the enclosed figures, in which.

Figure 1:
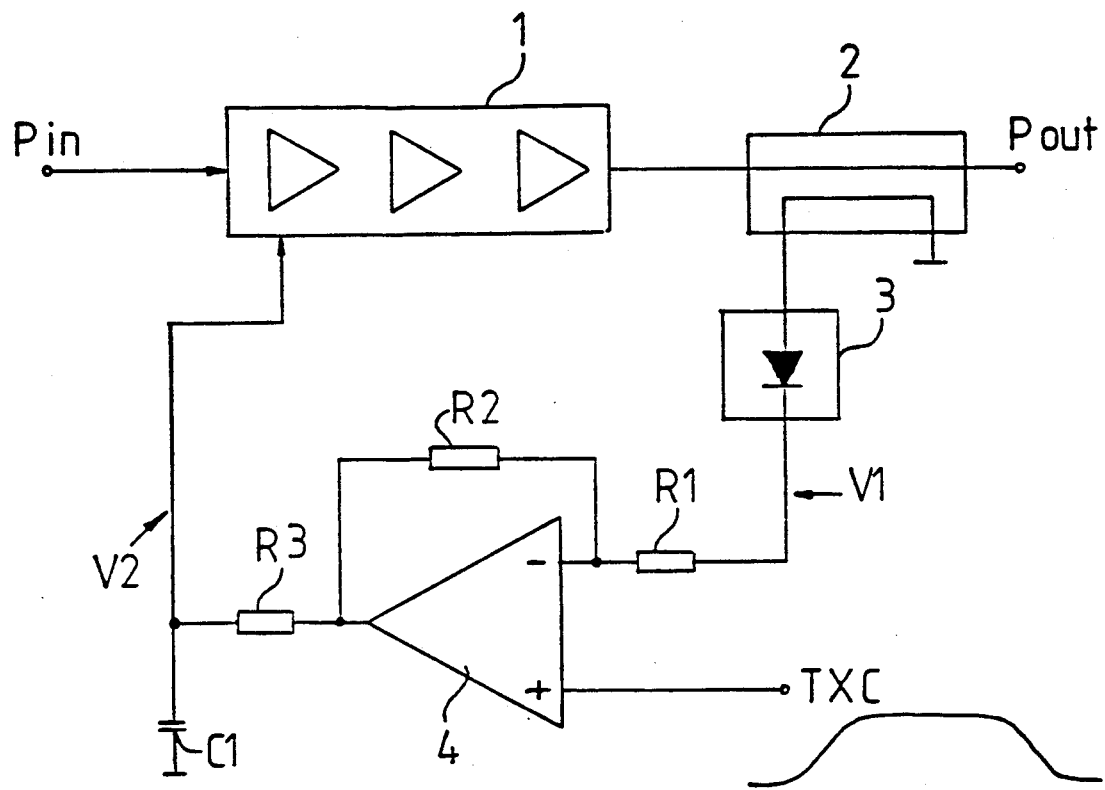
FIG. 1 shows the basic circuit arrangement of a transmitter in a prior art radio telephone.

A summary of the FIGS. 1-2 was already presented above when describing the prior art.

Figure 3:
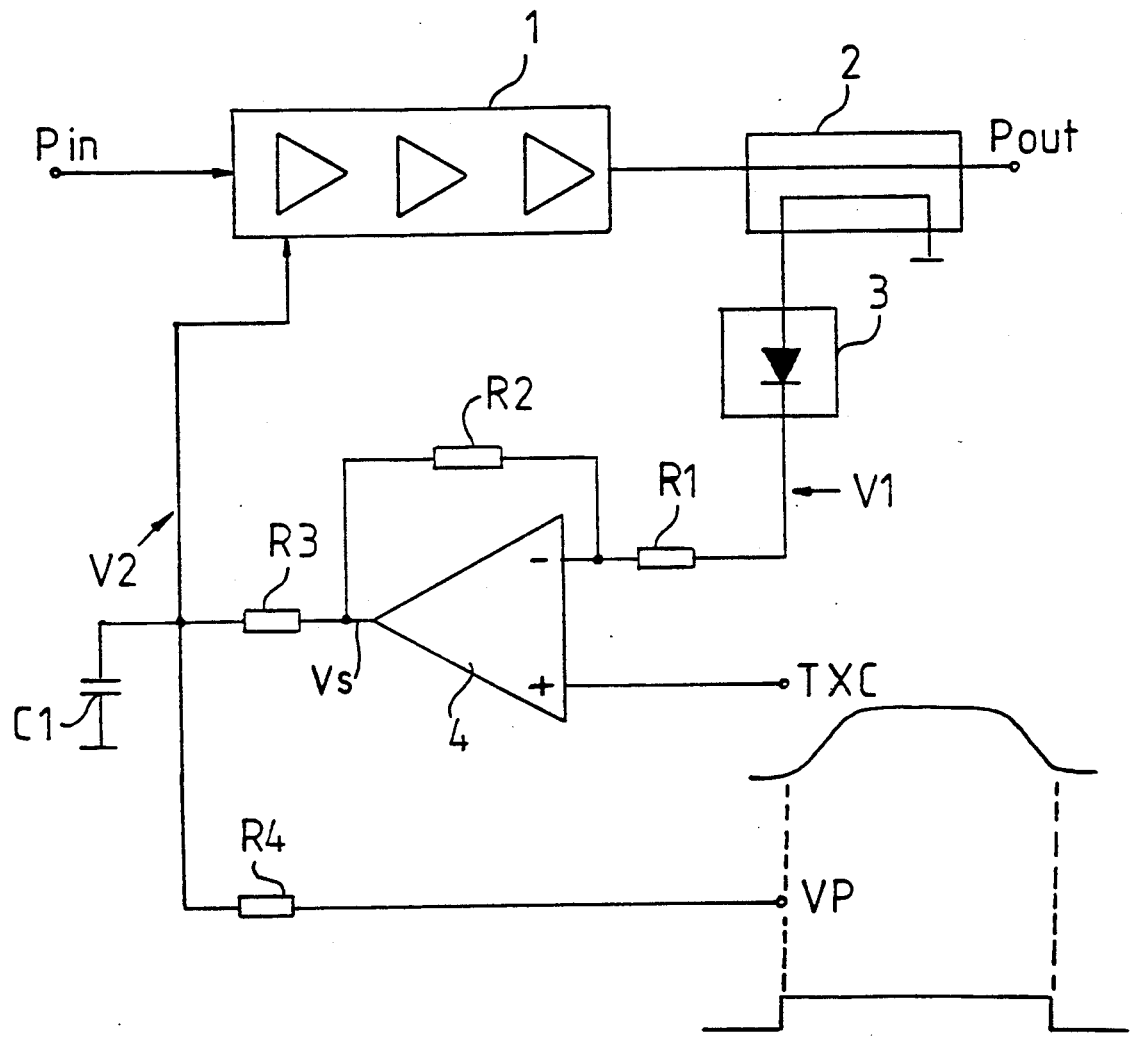
FIG. 3 shows the principle of the invention.

In the circuitry according to the invention in FIG. 3 the output voltage Vs of the control amplifier 4 is added after the resistor R3 to a squarewave pulse Vp having a height approximately the same as the voltage V3, above which the power amplifier 1 begins to produce power. The squarewave pulse begins substantially at the same moment when the control pulse TXC begins to rise. Then the capacitor C1 is rapidly charged through the resistor R4 to the proximity of the threshold level V3, and the power amplifier control loop is able to operate immediately when the power amplifier delivers power. If the squarewave pulse Vp has a voltage level higher than V3, then the control loop will compensate for the effect of the pulse above the level V3 so that the control amplifier 4 output, voltage Vs begins to decrease until the influence of the squarewave pulse on the control voltage V2 has been compensated, and thereafter the control voltage continues to rise. The arrangement works even if Vp would not exceed the value V3 and then the control amplifier output voltage Vs will not exhibit the mentioned "bend" when V2 exceeds the threshold level.

Figure 2A:
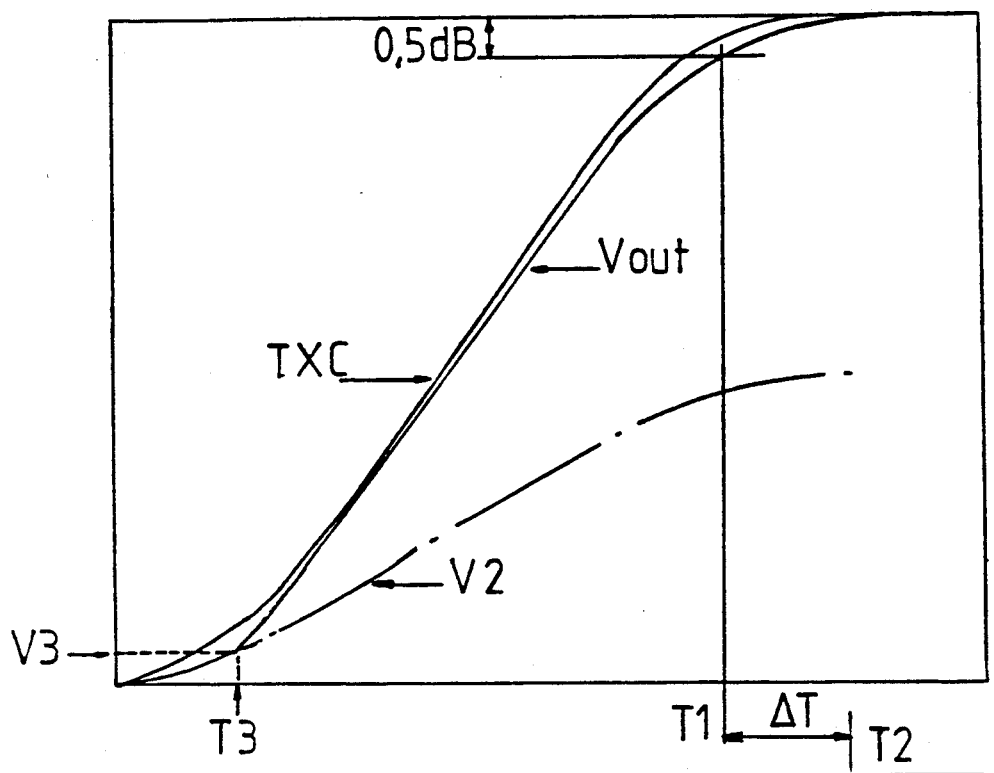
FIGS. 2A and 2B show the voltage forms at different points of the transmitter in FIG. 1 at a high and a low power level.
Figure 2B:
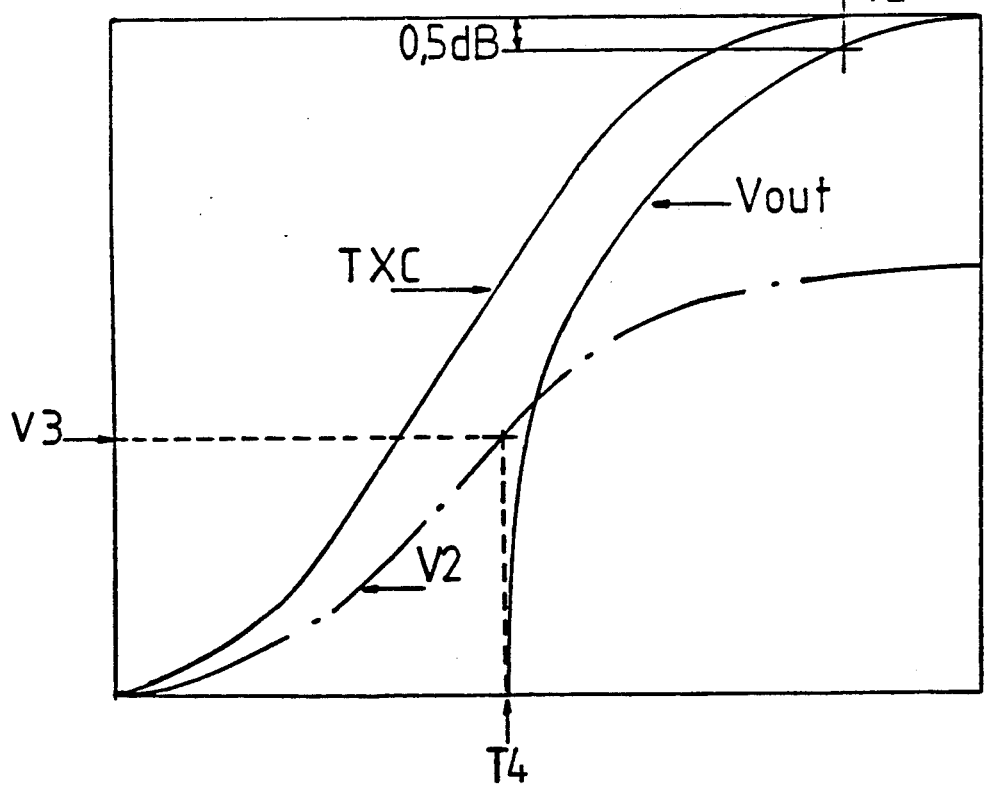
Figure 4A:
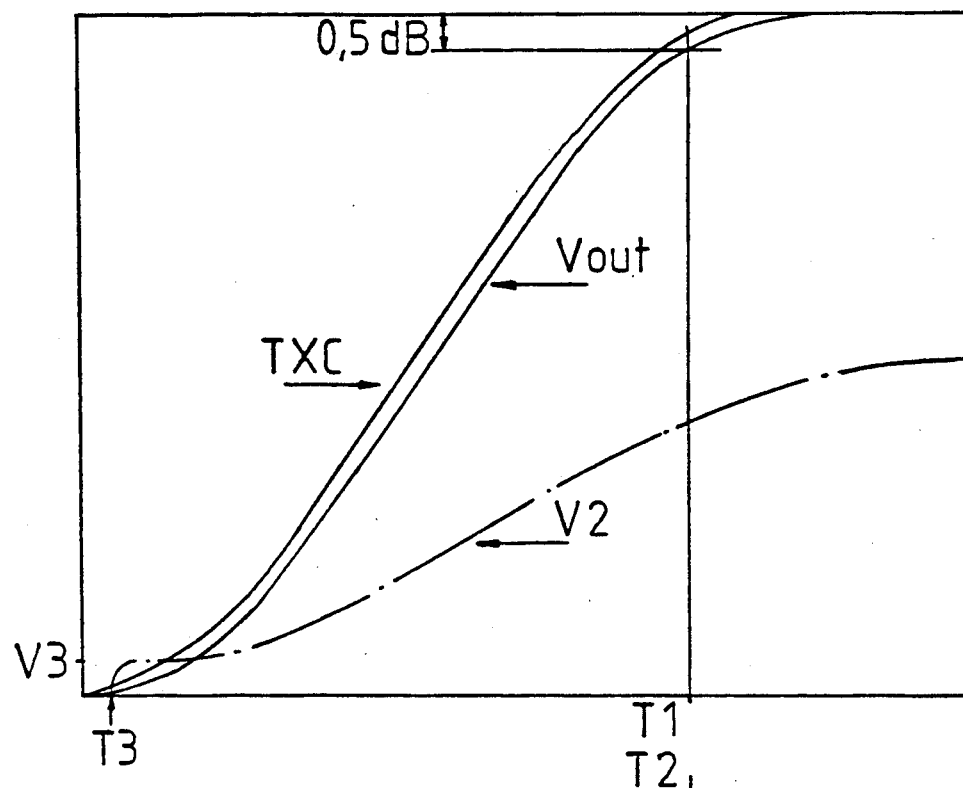
FIGS. 4A and 4B show the voltage forms at different points of the circuitry of the invention at a high and a low power level, respectively.
Figure 4B:
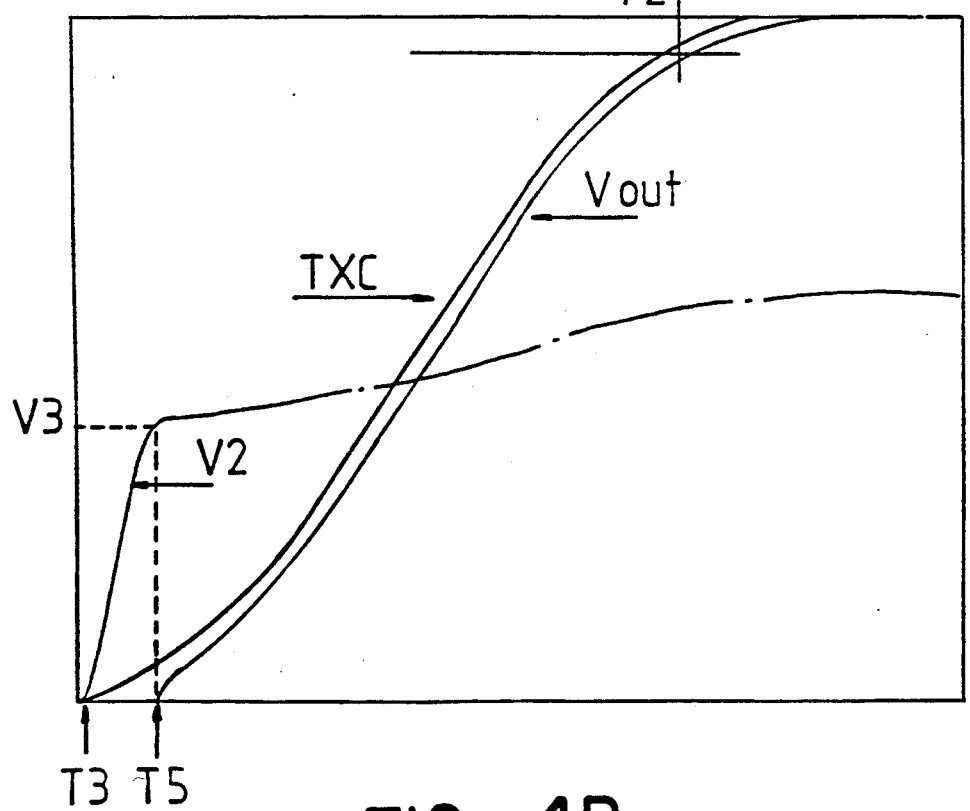

FIG. 4A shows the corresponding voltage graphs as FIG. 2A. It is observed, that when a squarewave pulse Vp is added to the control pulse TXC immediately at its beginning at T3, the control voltage V2 will rapidly rise to the value V3 and stay there for a short time, during which the power amplifier and the control loop begin to operate, and then it will begin to rise following the output voltage of the control amplifier 4. The function is the same in FIG. 4B showing graphs for low power levels. Comparing FIGS. 4A, 4B with FIGS. 2A, 2B it is clearly seen that there is no step-like rise in the power amplifier output voltage Vout when the squarewave pulse is added to the control voltage V2, but the voltage starts to rise without any significant delay, following closely the waveform of TXC and thus the desired $\cos^2$-waveform. In a corresponding way the shape of the pulse will keep to the $\cos^2$-waveform at the end of the transmission pulse, due to the squarewave pulse Vp.

Figure 5:
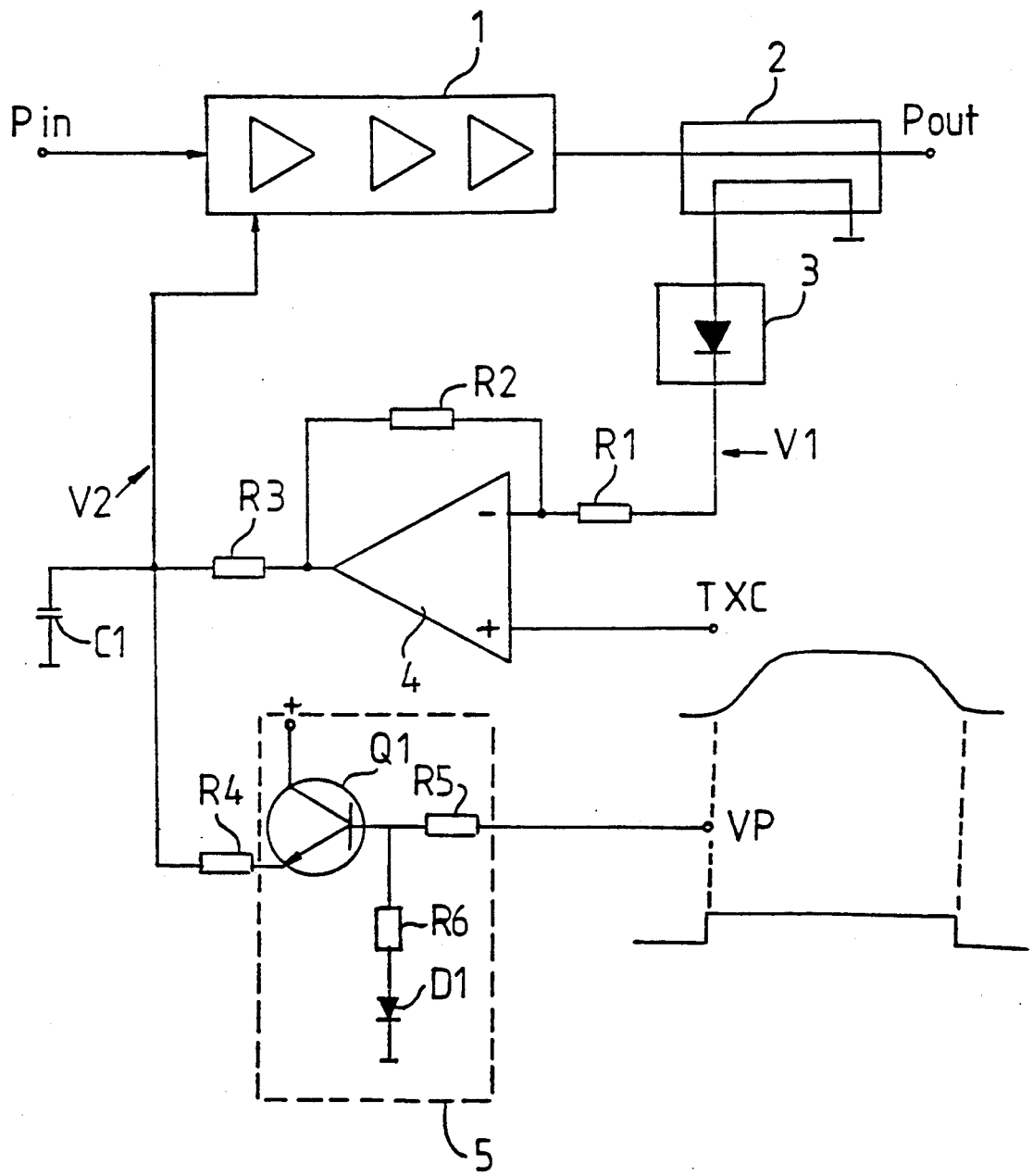
FIG. 5 is a preferred embodiment of the circuitry according to the invention.

The basic principle of the invention is presented above. In practice it could be inconvenient in some instances to use a squarewave pulse Vp with the same length as the control pulse TXC: due to simple resistive summing of the squarewave pulse and the control voltage a voltage division appears at the power amplifier output, affecting the power amplifier control loop and reducing the open-loop gain. It is self-evident that this could be compensated for by increasing the gain of the control amplifier 4. This is however possible only when the phase margin of the control amplifier permits the gain increase. This is not always the case, and then it is possible to use the basic circuit of an embodiment according to the invention shown in FIG. 5. There the squarewave pulse Vp is disconnected from the summing with a switch 5 immediately when the control loop begins to operate. Then it is possible to retain open-loop gain, and thus the power regulation is faster and more accurate than in the basic circuitry presented above. In accordance with the circuitry the squarewave pulse Vp is added to the control voltage V2 with the aid of a transistor Q1. When the pulse Vp reaches the base of the transistor, the capacitor C1 is rapidly charged through the resistor R4 and the voltage V2 will rapidly reach the threshold value at which the power amplifier 1 begins to operate, as is mentioned above. As the control pulse TXC from the control amplifier and through the resistor R3 now continues to rise, the base-emitter voltage of the transistor Q1 will be reduced because the base voltage is constant, i.e. Vp, and the emitter voltage is rising. Therefore the transistor will cease to conduct when the emitter voltage reaches the base voltage, and the resistor R4 is in a way disconnected from the respective circuit. At the end of the control pulse TXC the transistor begins to conduct when the voltage V2 has fallen below the threshold voltage V3, the squarewave pulse V2 being again added to the control voltage, which leads to a controlled shape of the transmission pulse.

Above the threshold voltage V3 the loop gain is thus not reduced due to the summing circuit and the control loop will operate fast and accurately. Due to the transistor circuit the resistor R4 may be dimensioned with a much lower value than with the summing circuit alone, with the result that the control voltage V2 can rise to the threshold level V3 with significant speed. In order to compensate for the base-emitter voltage temperature dependence it is possible to use a base-emitter temperature compensating circuit e.g. in a known way with the diode D1 and resistors R5 and R6.

In accordance with the invention the power amplifier transmission pulse is provided with a good $\cos^2$-shape and tracking of the control pulse TXC almost without delay, immediately at the beginning of the pulse. The presented means is useful at all required power levels. In accordance with the preferred embodiment it is possible to achieve a fast and accurate power regulation by using the disconnection of the summing circuit when the threshold has been reached. It is obvious to a person skilled in the art that the disconnection of the summing circuit may be realized in many ways without departing from the scope of the claims. The squarewave pulse can be produced e.g. in the logic section of the radio telephone or also with a comparator from the TXC-pulse.

The invention has been presented as applied to the described control loop in a radio telephone power amplifier, but it is appreciated that it may be applied to control loops realized in other ways.

I claim:

1. A method for controlling the rising and falling edges of an output pulse of a voltage controlled power amplifier (4) to track a waveform of a control pulse (TXC) when the power amplifier is controlled with a control loop producing a control voltage (V2) with the aid of a voltage (V1) proportional to the output pulse power (Pout) and with the aid of a control pulse (TXC), whose rising and falling edges are e.g. $\cos^2$-shaped, wherein a square wave pulse (Vp) is added to the control voltage (V2) of the power amplifier, the pulse (Vp) starting and ending substantially at the same times as the control pulse (TXC).

2. A method according to claim 1, wherein the voltage level of the squarewave pulse (Vp) is approximately the same as that value of the control voltage (V2), at which the control loop begins to operate.

3. A method according to claim 1 or 2, wherein the squarewave pulse (Vp) is added to the control voltage (V2) only during a time when the control voltage (V2)

is below that value (V3) at which the control loop begins to operate.

4. Circuitry to control the rising and falling edges of an output pulse of a voltage controlled power amplifier (4) to track a waveform of a control pulse (TXC) when the power amplifier is controlled with a control loop producing a control voltage (V2) with the aid of a voltage (V1) proportional to the output pulse power (Pout) and with the aid of a control pulse (TXC), whose rising and falling edges are e.g. $\cos^2$-shaped, comprising a summing circuit, in which a squarewave pulse (Vp) is added to the control voltage (V2) of the power amplifier, the pulse (Vp) starting and ending substantially at the same time as the control pulse (TXC).

5. Circuitry according to claim 4, and further comprising a switching means (5) for disconnecting the squarewave pulse (Vp) from the summing circuit during that time when the control loop is operating.

6. Circuitry according to claim 5, wherein the switching means (5) is a transistor circuit.

7. Circuitry according to claim 4, wherein the voltage of the squarewave pulse (Vp) is approximately the same as a value of the control voltage (V2) at which the control loop begins to operate.

8. Circuitry according to claim 4, wherein the summing circuit comprises summing resistors (R3 and R4).

9. A method for controlling the rising and falling edges of an output pulse signal of a voltage controlled power amplifier to track a selected waveform, said power amplifier beginning to output power when a predetermined level of control voltage signal is applied thereto, comprising the steps:
producing a first signal have a level proportionate to the output of said power amplifier;
providing a control pulse signal having at least rising and falling edges corresponding to said selected waveform;
inputting said first signal and said control pulse signal to respective terminals of a comparison circuit to produce a control voltage signal representing a difference between said control pulse signal and said first signal;
adding a square wave pulse to said control voltage signal to produce a summed signal, said square wave pulse starting and ending at the same times as said control pulse signal;
applying said summed signal as a control voltage for said voltage controlled power amplifier.

10. A method as in claim 9, and further comprising the step of providing said square wave pulse at a voltage level approximately the same as said predetermined level of said control voltage at which said power amplifier begins to output power.

11. A method as in claim 9 or 10, wherein said square wave pulse is added to said control voltage signal only during that time when said control voltage is below said predetermined level at which said power amplifier begins to output power.

12. A circuit to control the rising and falling edges of an output pulse signal of a voltage controlled power amplifier to a preselected waveform, said power amplifier beginning to output power when a predetermined level of control voltage signal is applied thereto, comprising:
means for detecting power level output of said voltage controlled power amplifier and for outputting a first signal corresponding to said output power level;
controlled pulse generator means for outputting a control pulse signal having at least rising and falling edges corresponding to said preselected waveform;
comparison means for receiving said first signal and said control pulse signal and outputting a control voltage signal corresponding to the difference between said first signal and said control pulse signal, said control voltage signal being applied to said power amplifier to provide a control loop;
circuit means for generating a square wave pulse, said square wave pulse starting and ending substantially at the same time as said control pulse signal;
adder means for receiving said control voltage signal and said square wave pulse and providing a summed signal therefrom, said summed signal being applied to said power amplifier control loop, said square wave having a voltage level at least equalling said predetermined level for starting said power amplifier to produce output power when said control voltage signal is too low to cause said amplifier to produce output power.

13. A control circuit as in claim 12, and further comprising switching means for disconnecting the square wave pulse from said added means when said power amplifier is outputting power and said control loop operates.

14. A control circuit as in claim 13, wherein said switching means includes a transistor circuit.

15. A control circuit as in claim 12, wherein said square wave pulse is supplied at a voltage level approximately the same as that predetermined level of the control voltage signal at which said power amplifier begins to output power.

16. A control circuit as in claim 12, wherein said adder means includes summing resistors.

17. A control circuit as in claim 12, wherein said selected waveform is $\cos^2$-shaped.

* * * * *